United States Patent
Katti (10) Patent No.: US 7,539,047 B2
(45) Date of Patent: May 26, 2009

(54) MRAM CELL WITH MULTIPLE STORAGE ELEMENTS

(75) Inventor: Romney R. Katti, Shorewood, MN (US)

(73) Assignee: Honeywell International, Inc., Morristown, NJ (US)

( * ) Notice: Subject to any disclaimer, the term of this patent is extended or adjusted under 35 U.S.C. 154(b) by 11 days.

(21) Appl. No.: 11/745,903

(22) Filed: May 8, 2007

(65) Prior Publication Data

US 2008/0278994 A1    Nov. 13, 2008

(51) Int. Cl.
G11C 11/00    (2006.01)

(52) U.S. Cl. .................. 365/158; 365/171; 365/173

(58) Field of Classification Search ............. 365/158, 365/171, 173
See application file for complete search history.

(56) References Cited

U.S. PATENT DOCUMENTS

| | | | |
|---|---|---|---|
| 6,531,723 B1 | 3/2003 | Engel et al. | |
| 6,545,906 B1 | 4/2003 | Savtchenko et al. | |
| 6,577,529 B1 | 6/2003 | Sharma et al. | 365/158 |
| 6,667,901 B1 | 12/2003 | Perner et al. | |
| 6,707,710 B1 * | 3/2004 | Holden | 365/158 |
| 6,754,097 B2 * | 6/2004 | Sharma et al. | 365/158 |
| 6,801,451 B2 * | 10/2004 | Tran et al. | 365/158 |
| 6,909,629 B2 | 6/2005 | Theel | |
| 6,924,520 B2 * | 8/2005 | Park et al. | 257/295 |
| 6,947,333 B2 * | 9/2005 | Smith | 365/189.16 |
| 6,950,333 B2 * | 9/2005 | Hiramoto et al. | 365/171 |
| 6,985,385 B2 | 1/2006 | Nguyen et al. | |
| 7,009,877 B1 | 3/2006 | Huai et al. | |
| 7,239,542 B2 * | 7/2007 | Ootsuka et al. | 365/158 |
| 7,336,528 B2 * | 2/2008 | Lim | 365/171 |
| 7,397,694 B2 * | 7/2008 | Chen et al. | 365/158 |

FOREIGN PATENT DOCUMENTS

| | | |
|---|---|---|
| EP | 1 398 835 A1 | 3/2004 |
| EP | 1 653 475 A1 | 5/2006 |
| JP | 2001-217398 | 8/2001 |

OTHER PUBLICATIONS

Magnetoresistive Random Access Memory, Freescale Semiconductor, Inc., Jun. 23, 2006.
Search Report for 08101298.1-2210 dated Jul. 11, 2008.

* cited by examiner

*Primary Examiner*—Huan Hoang
(74) *Attorney, Agent, or Firm*—McDonnell Boehnen Hulbert & Berghoff LLP (57) ABSTRACT

An improved MRAM cell may include a first, second, and third contact, a first MTJ between the first and second contact, and a MTJ between the second and third contact. The MRAM cell is nonconductive between the first and second MTJ. The first MTJ may include a first free layer with a first switching field, and the second MTJ may include a second free layer with a second switching field. If the first switching field is substantially higher than the second switching field, the first MTJ may be a reference element for the second MTJ. If the first switching field is adequately higher than the second switching field, the first and second MTJ may each contain a data bit. If the first switching field is substantially similar to the second switching field, the first and second MTJs may contain identical data bits connected in series.

16 Claims, 6 Drawing Sheets

MRAM CELL WITH MULTIPLE STORAGE ELEMENTS

GOVERNMENT RIGHTS

The United States Government has acquired certain rights in this invention pursuant to Contract No. N00030-06-C-0003 awarded by the United States Navy.

FIELD

The invention relates to magnetic random access memory (MRAM) and more particularly to an MRAM cell with multiple storage elements.

BACKGROUND

MRAM is a non-volatile memory technology that is gaining popularity in the computer market. Unlike other memory technologies (e.g., SRAM, DRAM, FLASH, etc.) that store data as electric charge or current flows, MRAM stores data as a magnetic state in a magnetic storage element (i.e., an MRAM cell). Typically, an MRAM cell includes two ferromagnetic layers, each of which can hold a magnetic field that has one of two possible polarities. Preferably, the possible polarities of the ferromagnetic layers will run either parallel or anti-parallel to an easy axis of the MRAM cell. The logic state of the MRAM cell may then depend on the polarity of the ferromagnetic layers. For example, if the ferromagnetic layers have the same polarity, the MRAM cell may be storing a "0." Alternatively, if the ferromagnetic layers have an opposite polarity, the MRAM cell may be storing a "1."

Generally, a device may read the stored data in an MRAM cell by passing a sensing current through the MRAM cell and then measuring an electrical resistance of the cell, which relates to the polarity of the ferromagnetic layers. In this respect, a higher resistance $R_{max}$ typically indicates that the ferromagnetic layers have an opposite polarity, whereas a lower resistance $R_{min}$ typically indicates that the ferromagnetic layers have the same polarity. A device may write data to an MRAM cell by applying to the MRAM cell a magnetic field that alters the magnetic state of one or both of the ferromagnetic layers. In this respect, the device may pass current through write lines adjacent to the MRAM cell to generate the magnetic field.

One example of an MRAM cell is a pseudo spin valve (PSV). The PSV may include two magnetic layers of different thicknesses, separated by a nonmagnetic conductive spacer layer. Both magnetic layers are "free" layers, meaning that both layers can switch polarity when subjected to an applied magnetic field. However, the thicker layer of the PSV, which stores the data, may require a larger magnetic field to switch its polarity (i.e., the thicker layer has a higher "switching field"). When reading a PSV, a device may measure the resistance of the PSV while applying magnetic fields that magnetize the thinner layer of the PSV, but not the thicker layer, in known directions. In this respect, the device may compare the resistance of the PSV when the thinner layer is magnetized in one direction with the resistance of the PSV when the thinner layer is magnetized in an opposite direction to determine the polarity of the thicker layer, and thus the logic state of the PSV. Typically, the difference in resistance for the two logic states of the PSV is approximately 5% (i.e., $R_{max}$ is approximately 5% higher than $R_{min}$).

Another example of an MRAM cell is a spin valve (SV). The SV may also include two magnetic layers separated by a nonmagnetic conductive spacer layer (e.g., Cu), and one of the SV's magnetic layers may be a free layer that stores data. However, the other magnetic layer of the SV may be a "pinned" layer, meaning that the layer's polarity is fixed in a known direction by an anti-ferromagnetic layer. As such, when reading an SV, a device may measure a resistance of the SV and then determine the polarity of the free layer, and thus the logic state of the SV, based on that resistance and the known direction of the fixed layer. For example, a device may compare that resistance to the resistance of a reference element. Similar to a PSV, the difference in resistance for the two logic states of the SV may be approximately 5%.

Yet another example of an MRAM cell is a magnetic tunnel junction (MTJ). Similar to the SV, the MTJ may include a free magnetic layer that stores data and a pinned magnetic layer. However, in the MTJ, the magnetic layers are separated by a nonmagnetic insulating barrier layer, as opposed to a conductive spacer layer. In this respect, a tunneling current may flow perpendicularly between the free layer and the pinned layer through the barrier layer. When reading an MTJ, a device may measure the resistance of the MTJ and then determine the polarity of the free layer, and thus the logic state of the MTJ, based on that resistance and the known direction of the fixed layer. For example, a device may compare that resistance to the resistance of a reference element. Unlike the PSV and SV described above, the difference in resistance for the two logic states of the SV may be approximately 50%. As such, read errors may be less likely in MRAM with MTJ elements.

The MRAM cells described above may have various limitations. For example, the PSV may require a destructive read process that includes writing two opposite bits to the thinner layer of the PSV. As such, reading the PSV may require additional power and time during that destructive write process, and may also create the potential for write errors. As another example, the PSV and the SV described above may only provide a resistance difference of 5% between logic states, which may lead to read errors. As a further example, the SV and MTJ described above may require a read process that relies on a reference element, which may impact the reliability of the read process and thus lead to read errors. As still a further example, the MRAM cells described above may provide a low output signal, thus making it difficult for a read architecture to accurately measure the signal and/or determine a logic state of the MRAM cell based on that signal. As still another example, the magnetic storage elements described above may only store a single bit of data. As such, there is a need for an MRAM cell that overcomes one or more of these limitations.

SUMMARY

An improved MRAM cell and methods for reading and writing the improved MRAM cell are described.

One example of the present invention may take the form of an improved MRAM cell. The MRAM cell may include (a) a first, second, and third contact, (b) a first magnetic tunnel junction (MTJ) element between the first and second contact, and (c) a MTJ element between the second and third contact. The MRAM cell is preferably substantially nonconductive between the first MTJ element and the second MTJ element, and thus little to no electrical current will flow between the first MTJ element and the second MTJ element. In one example, the resistances of the first and second MTJ elements may be substantially higher than the resistance of the second contact, such that any current flowing from one MTJ element in the direction of the other MTJ element will flow out of the second contact instead. As another example, the second contact may include an insulation layer that impedes the current flow between the first and second MTJ elements.

In the improved MRAM cell, the first MTJ element may include a first free layer with a first switching field, and the second MTJ element may include a second free layer with a second switching field. Depending on the design of the MTJ elements, and specifically the free layers, the MRAM cell may serve various purposes. For example, if the first switching field is higher (and preferably substantially higher) than the second switching field, the first MTJ may be a reference element for the second MTJ. In this respect, the MRAM cell may be self-referencing, which may improve the reliability of the read process. As another example, if the first switching field is higher than the second switching field, the first and second MTJ element may each contain a bit of data. In this respect, the MRAM cell may store multiple bits of data, and thus may have four possible logic states. As still another example, if the first switching field is substantially similar to the second switching field, the first and second MTJ elements may contain identical bits of data connected in series. In this respect, the MRAM cell may output a higher signal during a read process, which may limit read errors.

Another example of the present invention may take the form of a method of reading the MRAM cell described above. The method may include (a) applying a first voltage between the first contact and the second contact, (b) measuring a first resistance of the first MTJ element across the first contact and the second contact, (c) applying a second voltage between the second contact and the third contact, (d) measuring a second resistance of the second MTJ element across the second contact and the third contact, and (e) comparing the first resistance with the second resistance.

Additionally, if the first MTJ element is a reference element for the second MTJ element and the first MTJ element is holding a low bit, the method may also include (f) determining that the second MTJ element is holding a high bit if the second resistance is adequately higher than the first resistance and (g) determining that the second MTJ element is holding a low bit if the second resistance is adequately lower than the first resistance.

Alternatively, if the MTJ elements both contain bits of data, the method may further include (f) determining a logic state of the MRAM cell based solely on the first and second resistances if the first and second resistance are adequately different and (g) determining a logic state of the MRAM cell based on an external reference element if the first and second resistances are adequately similar. In this respect, the function of determining the logic state of the MRAM cell based solely on the first and second resistances may include (i) determining that the first MTJ element is holding a high bit and the second MTJ element is holding a low bit if the first resistance is adequately higher than the second resistance, and (ii) determining that the first MTJ element is holding a low bit and the second MTJ element is holding a high bit if the first resistance is adequately lower than the second resistance.

Yet another example of the present invention may take the form of a method of writing multiple bits to the MRAM cell described above, where the first MTJ element includes a first free layer with a first switching field, the second MTJ element includes a second free layer with a second switching field, and the first switching field is higher than the second switching field. The method may include (a) determining that a first logic state should be written to the first MTJ element, (b) applying a first magnetic field to the MRAM cell, wherein the first magnetic field has a direction representing the first logic state and a magnitude at or above the first switching field, (c) determining that a second logic state should be written to the second MTJ element, and (d) applying a second magnetic field to the MRAM cell if the first logic state is different than the second logic state, wherein the second magnetic field has a direction representing the second logic state and a magnitude at or above the second switching field but below the first switching field. In this respect, the first logic state may be a low or high bit, and the second logic state may be a high or low bit.

Still another example of the present invention may take the form of a method of reading the MRAM cell described above, where an output of the first MTJ element and an output of the second MTJ element are connected in series. The method may include (a) applying a first voltage between the first contact and the second contact, (b) applying a second voltage between the second contact and the third contact, (c) measuring a series resistance of the first MTJ element and the second MTJ, and (d) comparing the series resistance to an external reference element.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

DETAILED DESCRIPTION OF THE DRAWINGS

Figure 1:
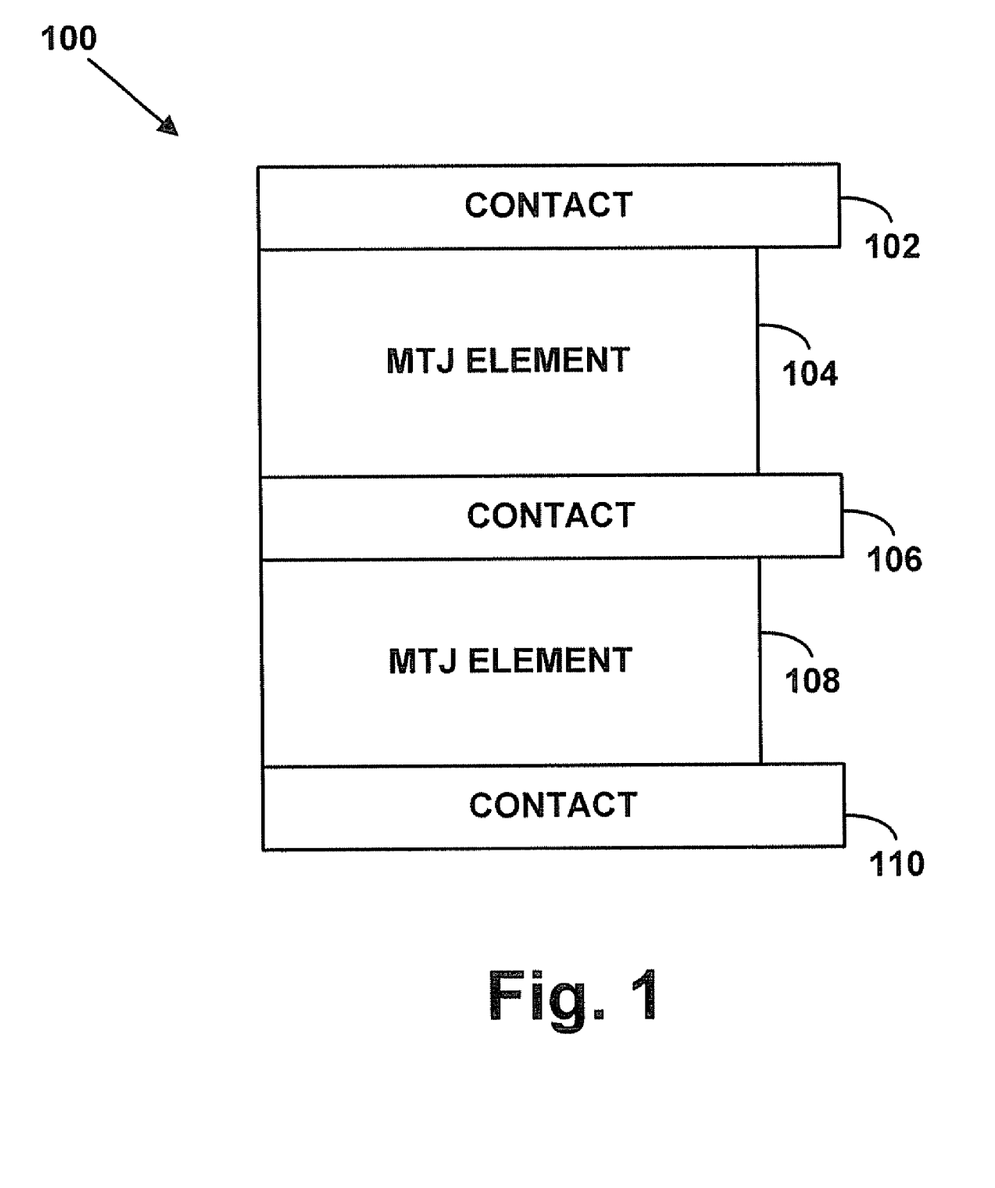
FIG. 1 is a schematic diagram of an MRAM cell, according to an example of the present invention.

Referring to the drawings, FIG. 1 is a schematic diagram of an MRAM cell 100, according to an example of the present invention. As shown, the MRAM cell 100 may include a first contact 102, a first magnetic tunnel junction (MTJ) element 104, a second contact 106, a second MTJ element 108, and a third contact 110. The first MTJ element 104 will preferably reside between the first contact 102 and the second contact 106. Similarly, the second MTJ element 108 will preferably reside between the second contact 106 and the third contact 110.

The MRAM cell 100 will preferably be substantially non-conductive between the first MTJ element 104 and the second MTJ element 108. As such, no electrical current will preferably flow between the first MTJ element 104 and the second MTJ element 108, except for negligible current due to leakage and/or other imperfections in the MRAM cell 100. In one example, the current between the first MTJ element 104 and the second MTJ element 108 may be impeded by a high resistance of the MTJ elements 104 and 108 relative to a resistance of the second contact 106. For instance, the resistances of the MTJ elements 104 and 108 may be approximately 1000 times greater the resistance of the second contact. In this respect, when current travels through the first MTJ element 104 towards the second MTJ element 108 (or vice versa), the current will pass through the lower-resistance second contact 106 as opposed to the higher-resistance second MTJ element 108. As another example, the second contact 106 may include an insulation layer 106a between two metal layers 106b and 106c, and the insulation layer 106a may then substantially prevent current from passing between the two metal layers 106b and 106c of the second contact 106.

The first MTJ element 104 may have a first logic state and the second MTJ element 108 may have a second logic state, thus enabling the MRAM cell 100 to store multiple logic states. Advantageously, an MRAM designer may then use the MRAM cell 100 and its multiple logic state capability to serve various purposes. For example, an MRAM designer may configure one MTJ element of the MRAM cell 100 as a reference element, thus allowing a logic state of the other MTJ element to be read locally without reference to an external reference element. As another example, an MRAM designer may configure the MRAM cell 100 to store multiple bits of data, thus allowing a larger storage capacity in a single MRAM cell. As still another example, an MRAM designer may configure the MRAM cell 100 to provide an increased output signal, thus allowing the logic state of the MRAM cell 100 to be read more easily. Other examples may exist as well.

Figure 2:
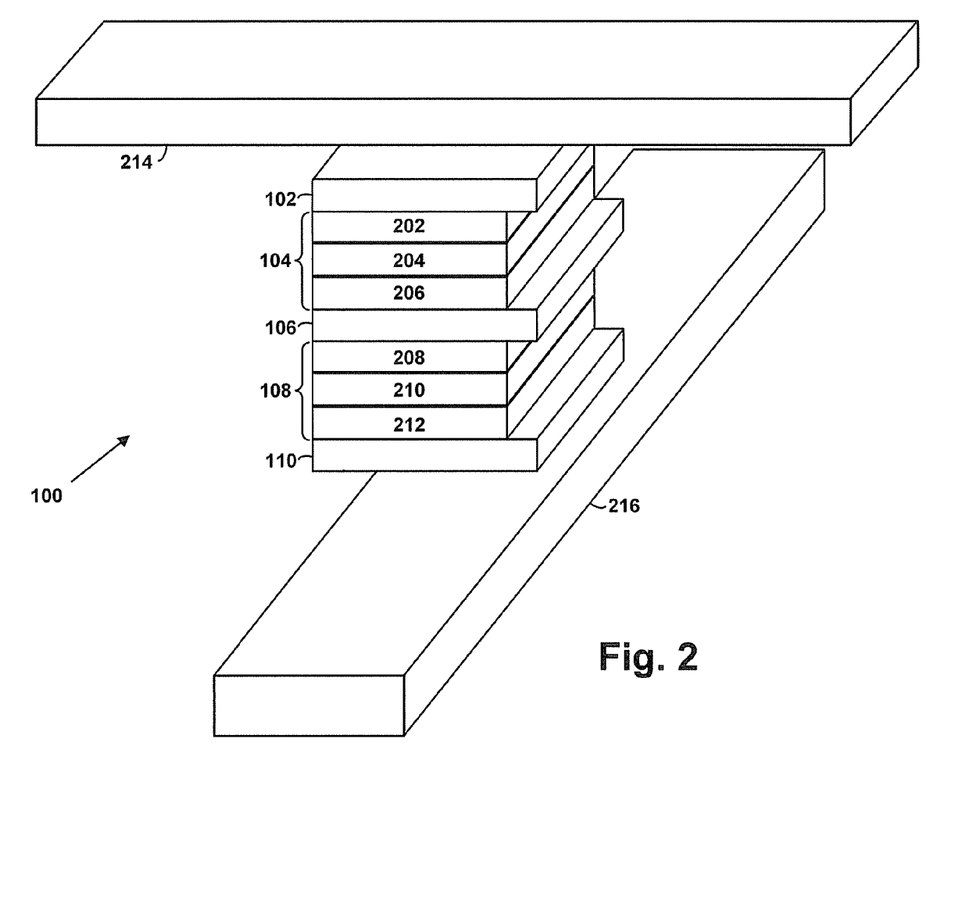
FIG. 2 depicts an exemplary embodiment of the MRAM cell of FIG. 1 with a write architecture.

FIG. 2 depicts an exemplary embodiment of the MRAM cell 100 with a write architecture. As shown, the MRAM cell 100 may still include the first MTJ element 104 between the first contact 102 and the second contact 106, and the second MTJ element 108 between the second contact 106 and the third contact 110. The first MTJ element 104 may include a first free layer 202 having a first switching field, a first insulating barrier 204, and a first pinned layer 206. Similarly, the second MTJ element 108 may include a second free layer 208 having a second switching field, a second insulating barrier 210, and a second pinned layer 212.

The free layers 202 and 208 of the MTJ elements 104 and 108 may be ferromagnetic layers that can have two different polarities, thus enabling the free layers 202 and 208 to represent two different logic states. For example, the free layers 202 and 208 may each be a layer of Nickel Iron Cobalt (NiFeCo) with a thickness of approximately 3 nm. However, as described below, the material and thickness of the free layers 202 and 208 may vary depending on the implementation of the MRAM cell 100. Further, the free layers 202 and 208 may be multi-layer structures as opposed to single layer structures. For example, the free layers 202 and 208 may each be a tri-layer structure that includes a first layer of NiFeCo with a thickness of approximately 1 nm, a layer of Ruthenium (Ru) with a thickness of approximately 1 nm, and a second layer of NiFeCo with a thickness of approximately 1 nm. Other examples are possible as well.

The insulating barriers 204 and 210 may be electrically insulating layers that are sufficiently thin to allow tunneling of charge carriers between the free layers 202 and 208 and the pinned layers 206 and 212. For example, the insulating barriers 204 and 210 may each be a layer of Aluminum Oxide (AlOx) with a thickness of approximately 1 nm. Other examples are possible as well.

The pinned layers 206 and 212 may include a ferromagnetic layer and an anti-ferromagnetic layer to fix the ferromagnetic layer to a known polarity. Preferably, both the pinned layers 206 and 212 will be fixed to the same known polarity. As an example, the pinned layers 206 and 212 may each include a ferromagnetic layer of NiFeCo with a thickness of approximately 2 nm and an anti-ferromagnetic layer of Iron Manganese (FeMn) with a thickness of approximately 5-10 nm. Further, the ferromagnetic and/or anti-ferromagnetic layers of the pinned layers 206 and 212 may be multi-layer structures as opposed to single layer structures. For example, the ferromagnetic layers of the pinned layers 206 and 212 may each be a tri-layer structure that includes a first layer of NiFeCo with a thickness of approximately 1 nm, a layer of Ru with a thickness of approximately 1 nm, and a second layer of NiFeCo with a thickness of approximately 1 nm. Other examples are possible as well.

The write architecture may include a first write line 214 adjacent to and above the first contact 102, and a second write line 216 adjacent to and below the third contact 110. Preferably, the first write line 214 will be separated from the first contact 102 and from the rest of the MRAM cell 100 by a first insulative spacer (not shown), and the second write line 216 will be separated from the second contact 110 and from the rest of the MRAM cell 100 by a second insulative spacer (not shown). The first write line 214 and second write line 216 may be arranged near the MRAM cell 100 such that a current passing through the first write line 214 and/or second write line 216 creates an applied magnetic field that acts on the MRAM cell 100. The first write line 214 is generally arranged to run perpendicular to the second write line 216. However, as one skilled in the art will understand, this arrangement is not necessary.

The process of changing a polarity of, and thus writing a logic state to, the free layers 202 and 208 with the write architecture may depend on (i) the magnitude and direction of the applied magnetic field and (ii) the switching fields of the free layers 202 and 208. For example, the polarity of a free layer may not change if the magnitude of the applied magnetic field does not exceed the switching field of the free layer. As another example, the polarity of a free layer may not change if the direction of the applied magnetic field matches the polarity of the free layer. As such, the polarity of a free layer, and thus the logic state of the MTJ element, may only change if the direction of the applied magnetic field opposes the polarity of the free layer and the magnitude of the applied magnetic field exceeds the switching field of the free layer. Thus, by controlling the applied magnetic field generated by the write architecture and the switching fields of the free layers 202 and 208, an MRAM designer may use the MRAM cell 100 to serve the purposes described above.

For example, an MRAM designer may design the MRAM cell 100 for use as a self-referencing MRAM cell. More particularly, the MRAM designer may set one of the two MRAM elements 104 and 108 as a reference element. To accomplish this, the MRAM designer may design the free layers such that the first switching field of the first free layer 202 is higher than the second switching field of the second free layer 208. Alternatively, the MRAM designer may design the free layers such that the second switching field of the second free layer 208 is higher than the first switching field of the first free layer 202. In either case, the free layer with the higher switching field will be referred to as the "reference free layer," and the free layer with the lower switching field will be referred to as the "data free layer."

The MRAM designer may control the switching fields of the free layers 202 and 208 by varying the thickness and/or material of the free layers. For example, if the first MTJ element 104 is the reference element, the first free layer 202 may be a single layer of NiFeCo with a thickness of approximately 5 nm or greater, whereas the second free layer 208 may be a single layer of NiFeCo with a thickness of approximately 3 nm. As another example, if the first MTJ element 104 is the reference element, the first free layer 202 may be a layer of NiFeCo with a thickness of approximately 5 nm, whereas the second free layer 208 may be a layer of NiFe with a thickness of approximately 3 nm. Many other examples are possible as well, including free layers with multi-layer structures.

In the self-referencing MRAM cell 100, the reference free layer's switching field will preferably be substantially higher than the data free layer's switching field. For example, the reference free layer may have a switching field in excess of 20 Oe, whereas the data free layer may only have a switching field of 10 Oe. In this respect, the high switching field of the reference free layer will preferably prevent the reference free layer from switching polarities when the write architecture applies any magnetic field to the MRAM cell 100 via the write lines 214 and 216. Thus, the MRAM designer may initially set the polarity of the reference free layer to a known polarity, and an MRAM device may then rely on the known polarity during a read process, as described in more detail below.

When writing data to the self-referencing MRAM cell 100, the write architecture may use known means for writing data to an MTJ element with a switching field substantially equivalent to the data MTJ element's switching field. For example, when writing a logic low bit (i.e., "0" bit) to the data MTJ element, the write architecture may activate the write lines 214 and 216 to generate an applied magnetic field that has a "0" bit direction and a magnitude at or above the data free layer's switching field. Similarly, when writing a logic high bit (i.e., "1" bit) to the data MTJ element, the write architecture may activate the write lines 214 and 216 to generate an applied magnetic field that has a "1" bit direction and a magnitude at or above the data free layer's switching field.

Figure 3:
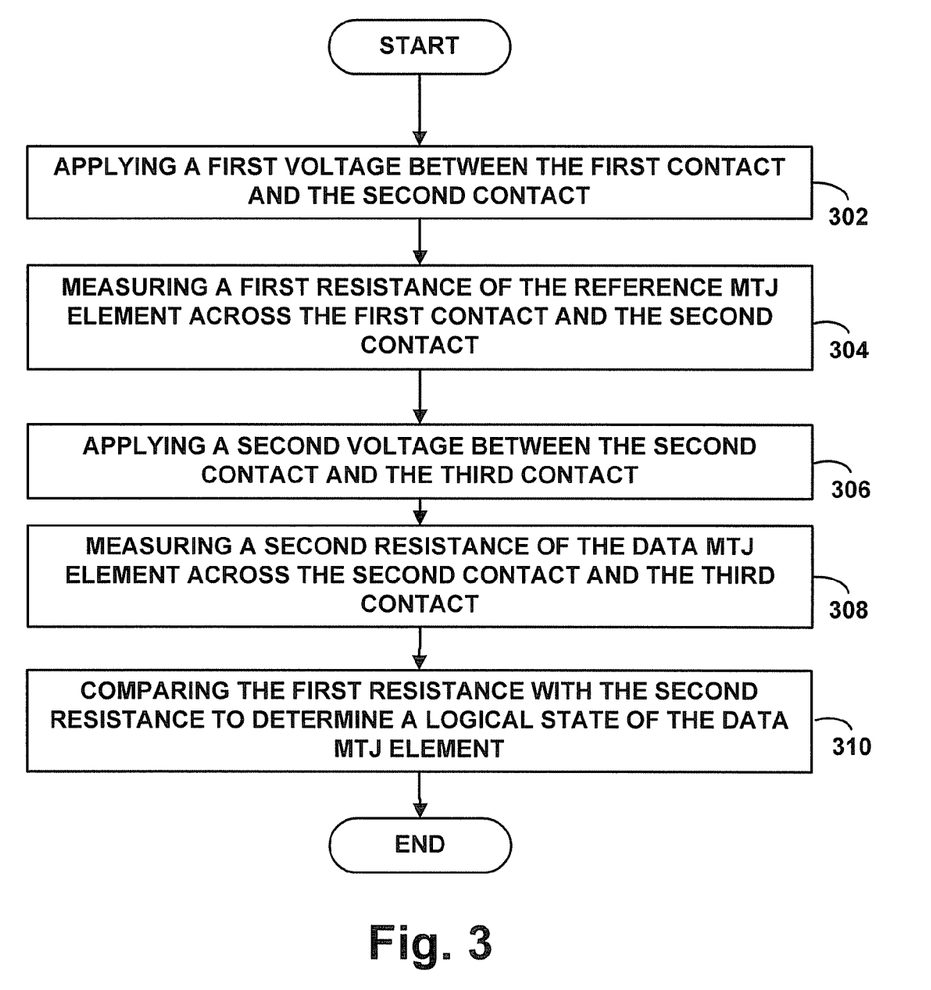
FIG. 3 is a flow chart depicting a method of reading a self-referencing example of the MRAM cell of FIG. 1, according to an example of the present invention.

FIG. 3 is a flow chart depicting a method of reading the self-referencing MRAM cell 100, according to an example of the present invention. For purposes of illustration, the following description will assume that the first MTJ element 104 is the reference element for the second MTJ element 108, resulting in the first free layer 202 being the reference free layer and the second free layer 208 being the data free layer. Further, the following description will assume that an MRAM designer preset the reference free layer 202 to the same polarity as the reference fixed layer 206, such that the reference MTJ element 104 holds a "0" bit (and thus has a resistance of $R_{min}$).

At step 302, a read architecture may apply a first voltage between the first contact 102 and the second contact 106 to generate a sensing current through the reference MTJ element 104. While the first voltage is being applied, at step 304, the read architecture may then measure a first resistance of the reference MTJ element 104 across the first contact 102 and the second contact 106. As described above, the first resistance of the reference MTJ element 104 relates to the polarity of the reference free layer 202 with respect to the known polarity of the reference fixed layer 206. Thus, because the reference MTJ element 104 was preset to hold a "0" bit, the first resistance will be $R_{min}$.

At step 306, the read architecture may apply a second voltage between the second contact 106 and the third contact 110 to generate a sensing current through the data MTJ element 108. Preferably, the first voltage and second voltage will be substantially similar. While the second voltage is being applied, at step 308, the read architecture may then measure a second resistance of the data MTJ element 108 across the second contact 106 and the third contact 108.

At step 310, the read architecture may then compare the first resistance with the second resistance to determine the logic state of the data MTJ element 108. If the second resistance is adequately higher than the first resistance, which is $R_{min}$, the read architecture may determine that the data MTJ element 108 is holding a "1" bit. Alternatively, if the second resistance is similar to the first resistance, which is $R_{min}$, the read architecture may determine that the data MTJ element 108 is holding a "0" bit. Alternatively yet, if the second resistance is adequately lower than the first resistance, the read architecture may repeat the read process and/or report an error.

Advantageously, the self-referencing MRAM cell 100 described herein may provide a read process that is more reliable than other read processes where an MRAM device relies upon an external reference element. Specifically, resistances generated by MTJ elements in the same MRAM cell, and which have experienced similar external effects, are more comparable than resistances generated by two spatially distinct MTJ elements. Further, the self-referencing MRAM cell 100 may provide a read process that is faster, more reliable, and less power hungry than destructive read processes that need to write bits to a layer of the MRAM cell.

Referring back to FIG. 2, an MRAM designer may alternatively design the MRAM cell 100 for use as a multiple-bit MRAM cell. More particularly, the MRAM designer may configure the MRAM cell 100 such that both MTJ elements 104 and 108 can hold a data bit (either "0" or "1" bit), thus enabling the MRAM cell 100 to hold four different logic bit sequences—"00," "01," "10," or "11." To accomplish this, the MRAM designer may once again design the free layers 202 and 208 such that one free layer has a higher switching field than the other free layer. However, unlike the self-referencing MRAM cell example described above, the multiple-bit MRAM cell 100 will preferably have two free layers with switching fields that are adequately, but not substantially, different. For example, in the multiple-bit MRAM cell 100, the first free layer 202 may have a switching field of 16 Oe, whereas the second free layer 208 may have a switching field of 8 Oe. In this respect, both free layers 202 and 208 can switch polarities when the write architecture applies magnetic fields to the multiple-bit MRAM cell 100, depending on the direction and magnitude of the applied magnetic field and the switching fields of the free layers 202 and 208.

As described above, the MRAM designer may control the switching fields of the free layers 202 and 208 by varying the thickness and/or material of the free layers. For example, if the first free layer 202 in the multiple-bit MRAM cell 100 has a higher switching field, the first free layer 202 may be a layer of NiFeCo with a thickness of approximately 4 nm, whereas the second free layer 208 may be a layer of NiFeCo with a thickness of approximately 3 nm. As another example, the first free layer 202 may be a layer of NiFeCo with a thickness of approximately 4 nm, whereas the second free layer 208 may be a layer of NiFe with a thickness of approximately 3 nm. Many other examples are possible as well, including free layers with multi-layer structures.

Figure 4:
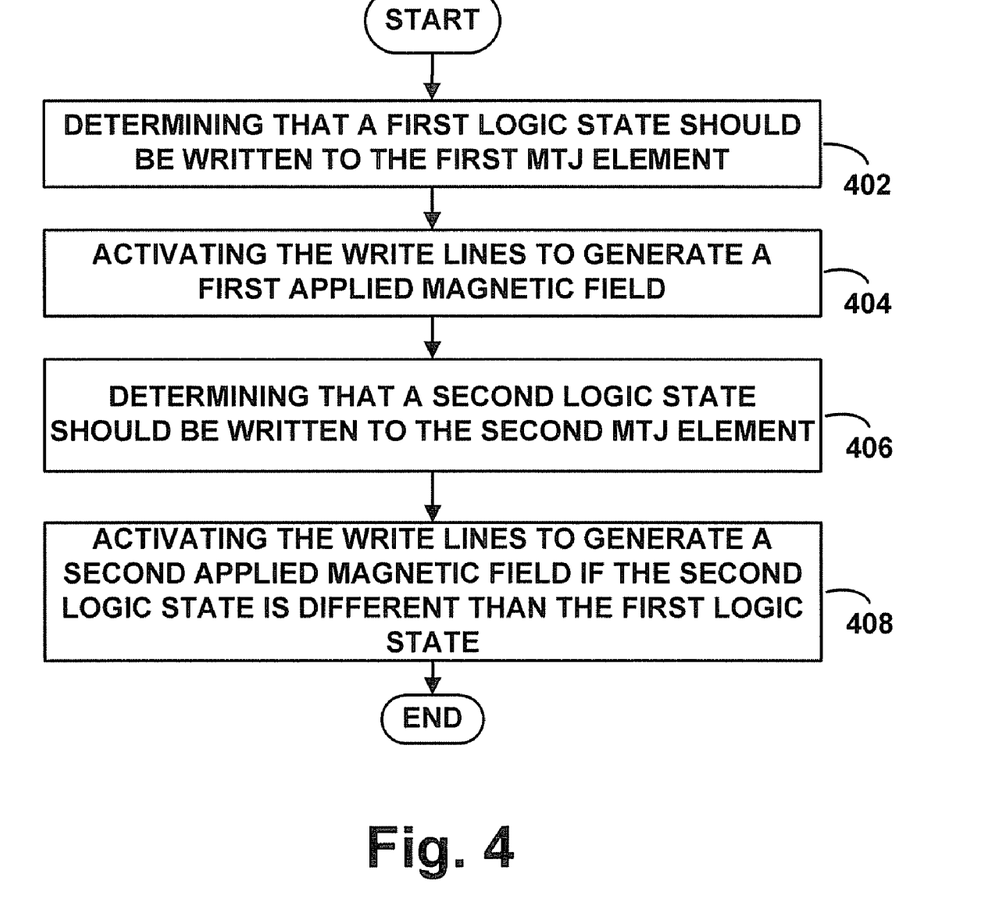
FIG. 4 is a flow chart depicting a method of writing a multiple-bit example of the MRAM cell of FIG. 1, according to an example of the present invention.

FIG. 4 is a flow chart depicting a method of writing the multiple-bit MRAM cell 100, according to an example of the present invention. For purposes of illustration, the following description will assume that the first switching field of the first free layer 202 is higher than the second switching field of the second free layer 208. Further, the following description will assume the first MTJ element 104 holds the lower order bit for the MRAM cell 100, whereas the second MTJ element 108 holds the higher order bit. Further yet, the following description will assume that the write architecture includes components for determining what data should be written to the MRAM cell, such as a processor.

At step 402, the write architecture may determine that a first logic state should be written to the first MTJ element 104, and specifically the first free layer 202 with the higher switching field. The first logic state may either be a "0" or a "1." Once the write architecture determines the first logic state, at step 404, the write architecture may then activate the write lines 214 and 216 to generate a first applied magnetic field, which preferably has a direction representing the first logic state and a magnitude at or above the first switching field. As a result of the first applied magnetic field, both the first MTJ element 104 and the second MTJ element 108 will be in the first logic state, regardless of their previous logic state. For example, if the first logic state is "0," then the MRAM cell 100 will be storing "00." Alternatively, if the first logic state is "1," then the MRAM cell 100 will be storing "11."

At step 406, the write architecture may then determine that a second logic state should be written to the second MTJ element, and specifically the second free layer 208 with the lower switching field. The second logic state may either be a "0" or a "1," and may either be the same or different than the first logic state. If the second logic state is the same as the first logic state, the write process is complete because the second MTJ element is already in the first logic state as a result of the first applied magnetic field.

However, if the second logic state is different than the first logic state, at step 408, the write architecture may then activate the write lines 214 and 216 to generate a second applied magnetic field, which preferably has a direction representing the second logic state and a magnitude at or above the second switching field but below the first switching field. As a result of the second applied magnetic field, the first MTJ element 104 will continue to have the first logic state, but the second MTJ element 108 will change to the second logic state. For example, if the first logic state is "0" and the second logic state is "1," then the MRAM cell 100 will be storing a "10" after the second magnetic field is applied. Alternatively, if the first logic state is "1" and the second logic state is "0," then the MRAM cell will be storing a "01" after the second magnetic field is applied.

Figure 5:
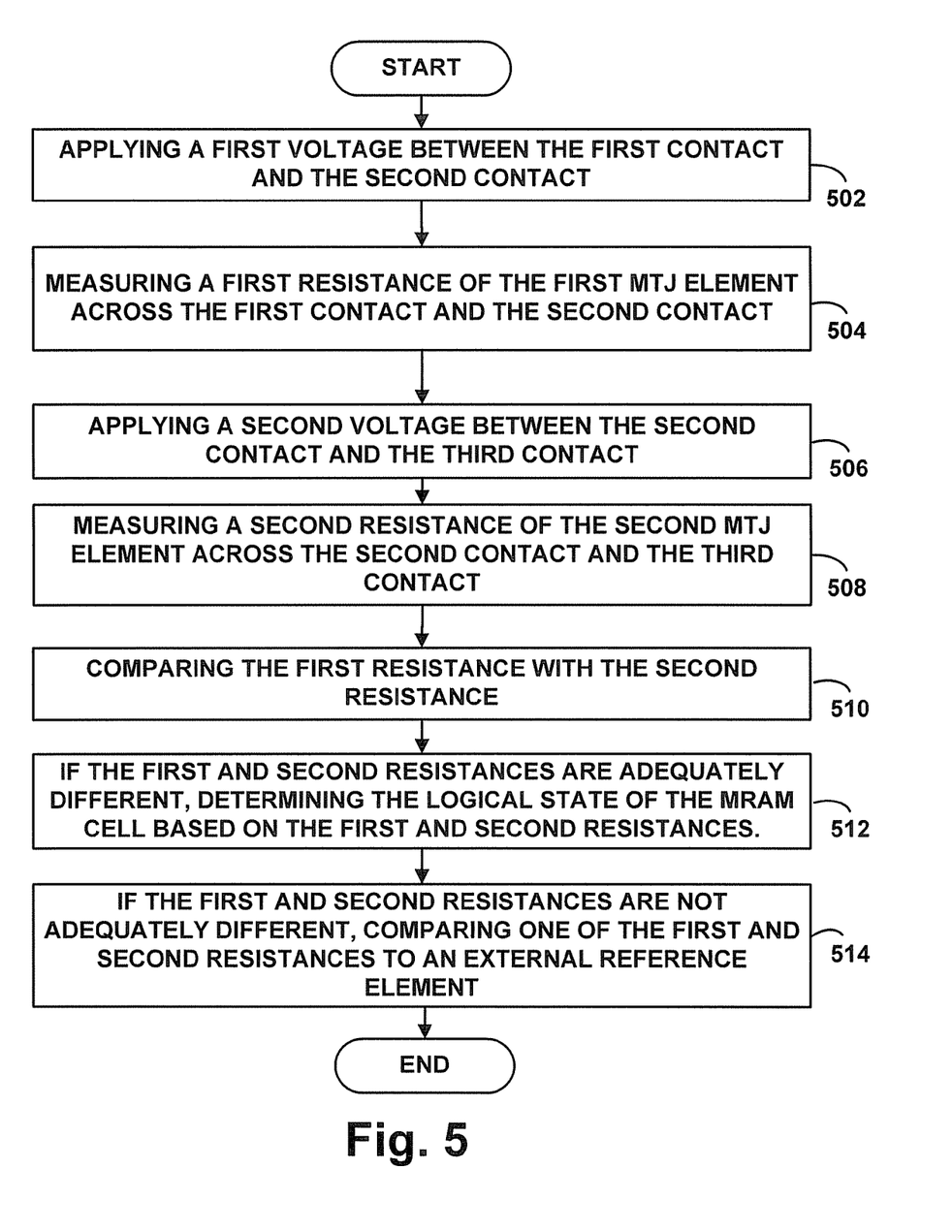
FIG. 5 is a flow chart depicting a method of reading a multiple-bit example of the MRAM cell of FIG. 1, according to an example of the present invention.

FIG. 5 is a flow chart depicting a method of reading the multiple-bit MRAM cell 100, according to an example of the present invention. Similar to the description with reference to FIG. 4, the following description will assume that the first switching field of the first free layer 202 is higher than the second switching field of the second free layer 208. Further, the following description will assume the first MTJ element 104 holds the lower order bit for the MRAM cell 100, whereas the second MTJ element 108 holds the higher order bit.

At step 502, the read architecture may apply a first voltage between the first contact 102 and the second contact 106 to generate a sensing current through the first MTJ element 104. While the first voltage is being applied, at step 504, the read architecture may then measure a first resistance of the first MTJ element 104 across the first contact 102 and the second contact 106.

At step 506, the read architecture may apply a second voltage between the second contact 106 and the third contact 110 to generate a sensing current through the second MTJ element 108. Preferably, the first voltage and second voltage will be substantially similar. While the second voltage is being applied, at step 508, the read architecture may then measure a second resistance of the second MTJ element 108 across the second contact 106 and the third contact 108.

At step 510, the read architecture may then compare the first resistance with the second resistance. If the first resistance and the second resistance are adequately different, at step 512, the read architecture may then determine the logic state of the multiple-bit MRAM cell 100 based primarily on the first and second resistances. For example, if the first resistance is adequately higher than the second resistance, the read architecture may determine that the first MTJ element 104 is holding a "1" bit and the second MTJ element 108 is holding a "0" bit, thus resulting in the MRAM cell 100 holding a "01." Alternatively, if the first resistance is adequately lower than the second resistance, the read architecture may determine that the first MTJ element 104 is holding a "0" bit and the second MTJ element 108 is holding a "1" bit, thus resulting in the MRAM cell 100 holding a "10."

If the first resistance and the second resistance are not adequately different, at step 514, the read architecture may determine the logic state of one of the MTJ elements 104 and 108 of the multiple-bit MRAM cell 100 according to known means for determining the logic state of an MTJ element. As such, for example, the read architecture may compare either the first resistance or the second resistance to an external reference element. Once the read architecture determines the logic state of one of the MTJ elements 104 and 108, the read architecture will then know the logic state of the MRAM cell 100, because the resistances, and thus the logic states, of both MTJ elements 104 and 108 are substantially the same.

Advantageously, the multiple-bit MRAM cell 100 described herein may provide a MRAM with a larger storage capacity, because multiple bits can be stored per MRAM cell. Further, the multiple-bit MRAM cell 100 may also provide an improved read process, because an external reference element may not be required in all circumstances. Other benefits of the multiple-bit MRAM cell 100 may exist as well.

Referring again to FIG. 2, an MRAM designer may still alternatively design the MRAM cell 100 for use as a double-signal MRAM cell. More particularly, the MRAM designer may configure the MRAM cell 100 such that both MTJ elements 104 and 108 hold the same data bit at any given time. To accomplish this, the MRAM designer may design the free layers 202 and 208 such that they have substantially similar switching fields. The MRAM designer may then connect a first output of the first MTJ element 104 in series with a second output of the second MTJ element 108, thus resulting in an MRAM cell 100 with an increased output. For example, the MRAM designer may connect an output across the first and second contact in series with an output across the second and third contact.

As described above, the MRAM designer may control the switching fields of the free layers 202 and 208 by varying the thickness and/or material of the free layers. Preferably, the free layers 202 and 208 will have substantially the same material and thickness, to provide substantially similar switching fields. Alternatively, however, the free layers 202 and 208 may have different materials and/or thicknesses that still provide substantially similar switching fields.

When writing data to the double-signal MRAM cell 100, the write architecture may use known means for writing data to an MTJ element with a switching field substantially equivalent to the switching field of the substantially similar MTJ elements 104 and 108. For example, when writing a "0" bit to the data MTJ element, the write architecture may activate the write lines 214 and 216 to generate an applied magnetic field that has a "0" bit direction and a magnitude at or above the switching field of the substantially similar MTJ elements 104 and 108. Similarly, when writing a "1" bit to the data MTJ element, the write architecture may activate the write lines 214 and 216 to generate an applied magnetic field that has a "1" bit direction and a magnitude at or above the switching field of the substantially similar MTJ elements 104 and 108.

Figure 6:
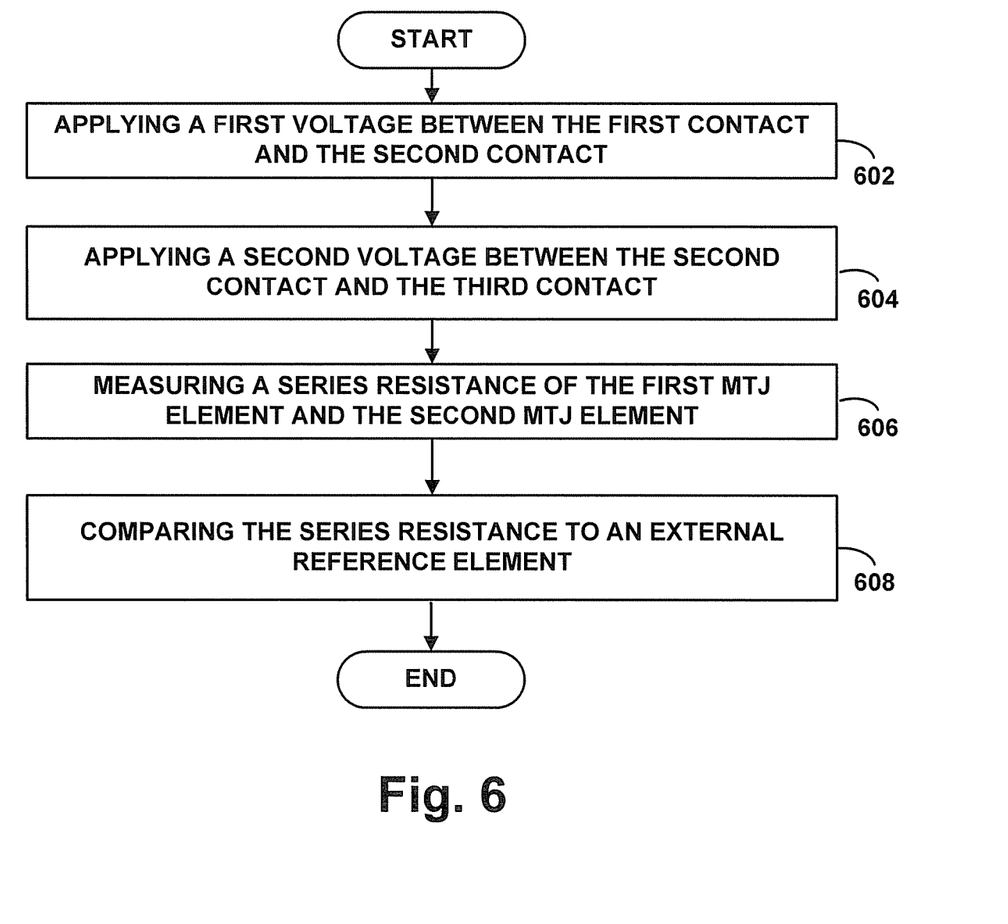
FIG. 6 is a flow chart depicting a method of reading a double-signal example of the MRAM cell of FIG. 1, according to an example of the present invention.

FIG. 6 is a flow chart depicting a method of reading the double-signal MRAM cell 100, according to an example of the present invention. At step 602, the read architecture may apply a first voltage between the first contact 102 and the second contact 106 to generate a sensing current through the first MTJ element 104. Simultaneously, at step 604, the read architecture may apply a second voltage between the second contact 106 and the third contact 110 to generate a sensing current through the second MTJ element 108. Preferably, the first voltage and second voltage will be substantially similar.

While the first and second voltage is being applied, at step 606, the read architecture may then measure a series resistance of the first MTJ element 104 and the second MTJ element 108. Preferably, the MRAM cell 100 will be designed such that it has a fabricated connection between an output of the first MTJ element 104, which may be across the first and second contacts, and an output of the second MTJ element 108, which may be across the second and third contacts. As such, the read architecture can measure a resistance across this fabricated connection. However, other methods for measuring the series resistance exist as well.

At step 608, after measuring the series resistance of the first MTJ element 104 and the second MTJ element 108, the read architecture may then determine the logic state of the MRAM cell 100 by comparing the series resistance of the double-signal MRAM cell 100 to an external reference element. In this respect, the external reference element may have a resistance of $R_{max}+R_{min}$, and the double-signal MRAM cell 100 may have an output of either $2*R_{max}$ or $2*R_{min}$. Other examples are possible as well. Advantageously, the double-signal MRAM cell 100 described herein may provide a more reliable read process, because the higher output generated by the double-signal MRAM cell 100 may be easier for the read architecture to measure accurately. Further, the higher output generated by the double-signal MRAM cell 100 may be more easily compared to the external reference element when determining the logic state of the cell. As such, read errors are less likely to occur.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. An MRAM cell comprising:
   a first, second, and third contact;
   a first magnetic tunnel junction element between the first and second contact, wherein the first magnetic junction element includes a first free layer with a first switching field; and
   a second magnetic tunnel junction element between the second and third contact, wherein the second magnetic junction element includes a second free layer with a second switching field, wherein the MRAM cell is substantially nonconductive between the first magnetic tunnel junction element and the second magnetic tunnel junction element, and wherein the first switching field is stronger than the second switching field.

2. The MRAM cell of claim 1, wherein the first magnetic tunnel junction element has a first resistance, wherein the second magnetic tunnel junction has a second resistance, wherein the second contact has a third resistance, and wherein the first resistance and the second resistance are substantially higher than the third resistance.

3. The MRAM cell of claim 1, wherein the second contact includes an insulation layer.

4. The MRAM cell of claim 1, wherein the first magnetic junction element comprises a reference element for the second magnetic junction element.

5. The MRAM cell of claim 1, wherein the first magnetic junction element contains a first bit of data, and wherein the second magnetic junction element contains a second bit of data.

6. The MRAM cell of claim 1, wherein the first magnetic junction element further includes a first insulating barrier and a first pinned layer, and wherein the second magnetic junction element further includes a second insulating barrier and a second pinned layer.

7. The MRAM cell of claim 6, wherein:
   the first free layer is adjacent to the first contact;
   the first pinned layer is adjacent to the second contact;
   the first insulating barrier is between the first free layer and the first pinned layer;
   the second free layer is adjacent to the second contact;
   the second pinned layer is adjacent to the third contact; and
   the second insulating barrier is between the second free layer and the second pinned layer.

8. An MRAM cell comprising:
   a first, second, and third contact;
   a first magnetic tunnel junction element between the first and second contact, wherein the first magnetic junction element includes a first free layer with a first switching field; and
   a second magnetic tunnel junction element between the second and third contact, wherein the second magnetic junction element includes a second free layer with a second switching field, and wherein the second contact includes an insulation layer that causes the MRAM cell to be substantially nonconductive between the first magnetic tunnel junction element and the second magnetic tunnel junction element.

9. The MRAM cell of claim 8, wherein the first magnetic junction element further includes a first insulating barrier and a first pinned layer, and wherein the second magnetic junction element further includes a second insulating barrier and a second pinned layer.

10. The MRAM cell of claim 9, wherein:
    the first free layer is adjacent to the first contact;
    the first pinned layer is adjacent to the second contact;
    the first insulating barrier is between the first free layer and the first pinned layer;
    the second free layer is adjacent to the second contact;
    the second pinned layer is adjacent to the third contact; and
    the second insulating barrier is between the second free layer and the second pinned layer.

11. The MRAM cell of claim 8, wherein the first switching field is stronger than the second switching field.

12. The MRAM cell of claim 11, wherein the first magnetic junction element comprises a reference element for the second magnetic junction element.

13. The MRAM cell of claim 11, wherein the first magnetic junction element contains a first bit of data, and wherein the second magnetic junction element contains a second bit of data.

14. The MRAM cell of claim 8, wherein the first switching field is substantially similar to the second switching field.

15. The MRAM cell of claim 14, wherein the first magnetic tunnel junction element and the second magnetic tunnel junction element contain the same bit of data.

16. The MRAM cell of claim 14, wherein an output of the first magnetic junction element and an output of the second magnetic tunnel junction element are coupled together to provide an increased output signal.

* * * * *